US008529707B2

(12) United States Patent
Namba

(10) Patent No.: US 8,529,707 B2
(45) Date of Patent: Sep. 10, 2013

(54) LIQUID PROCESSING APPARATUS, LIQUID PROCESSING METHOD, AND STORAGE MEDIUM HAVING COMPUTER PROGRAM RECORDED THEREIN

(75) Inventor: Hiromitsu Namba, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 211 days.

(21) Appl. No.: 13/158,651

(22) Filed: Jun. 13, 2011

(65) Prior Publication Data

US 2011/0308554 A1 Dec. 22, 2011

(30) Foreign Application Priority Data

Jun. 18, 2010 (JP) ................. 2010-139781

(51) Int. Cl.
*B08B 3/04* (2006.01)

(52) U.S. Cl.
USPC ............. 134/26; 134/18; 134/25.1; 134/25.5; 134/27; 134/28; 134/32; 134/33; 134/34; 134/36; 134/41; 134/42; 134/96.1; 134/99.1; 134/149; 134/153; 134/154; 134/155; 134/157; 134/158; 134/182; 134/183; 134/902; 438/748; 438/906; 257/E21.228; 216/92

(58) Field of Classification Search
USPC ................. 134/18, 25.1, 25.5, 26, 27, 28, 32, 134/33, 34, 36, 41, 42, 96.1, 99.1, 149, 153, 134/154, 155, 157, 158, 182, 183, 902; 216/92; 438/748, 906; 257/E21.228
See application file for complete search history.

(56) References Cited

U.S. PATENT DOCUMENTS

2006/0076034 A1* 4/2006 Nam et al. .................. 134/2
2008/0280054 A1* 11/2008 Ogata et al. ................. 427/425
2011/0308549 A1* 12/2011 Minami et al. .............. 134/18

FOREIGN PATENT DOCUMENTS

| JP | 2000-077293 A | 3/2000 |
| JP | 2001-085310 A | 3/2001 |
| JP | 2001-284315 A | 10/2001 |
| JP | 2007-318016 A | 12/2007 |

* cited by examiner

Primary Examiner — Bibi Carrillo
(74) Attorney, Agent, or Firm — Abelman, Frayne & Schwab

(57) ABSTRACT

Provided is a liquid processing apparatus in which a target substrate is horizontally held on a substrate holding unit and rotated around a vertical shaft, and the chemicals are supplied from a chemical supplying unit to the bottom surface of the target substrate that is rotating. In particular, the liquid processing apparatus performs a first step in which the chemicals are supplied to the target substrate while rotating the target substrate at a first rotation speed, a second step in which the supply of the chemicals is halted and the chemicals are thrown off by rotating the target substrate at a second rotation speed higher than the first rotation speed, and a third step in which the rinse liquid is supplied to the target substrate while rotating the target substrate at a third rotation speed equal to or lower than the first rotation speed.

6 Claims, 10 Drawing Sheets (a) STEP 1

HF SOLUTION (b) STEP 2

HALT (c)

RINSE LIQUID (a) STEP 3

RINSE LIQUID (b)

HALT (a) EXAMPLE (b) COMPARATIVE EXAMPLE

LIQUID PROCESSING APPARATUS, LIQUID PROCESSING METHOD, AND STORAGE MEDIUM HAVING COMPUTER PROGRAM RECORDED THEREIN

CROSS-REFERENCE TO RELATED APPLICATIONS

This application is based on and claims priority from Japanese Patent Application No. 2010-139781, filed on Jun. 18, 2010, with the Japanese Patent Office, the disclosure of which is incorporated herein in its entirety by reference.

TECHNICAL FIELD

The present disclosure relates to a technology for removing chemicals by supplying a rinse agent to a target substrate processed with the chemicals.

BACKGROUND

For example, a manufacturing process of a semiconductor device includes a single wafer type chemical processing for rotatably holding a semiconductor wafer (hereinafter, referred to as a "wafer") which is a target substrate around a vertical shaft and supplying various chemicals onto a target surface while rotating the wafer. As the chemical processing is completed, the wafer is then subject to a rinse processing for removing the chemicals by supplying a rinse agent such as deionized water onto the target surface while continuously rotating the wafer.

Japanese Patent Application Laid-Open No. 2007-318016 discloses a single wafer type liquid processing apparatus for removing a thin film of a peripheral cross section by supplying chemicals such as an etchant from a bottom surface of the wafer which is horizontally held in order to remove an unnecessary thin film formed on the peripheral cross section of the wafer in a film forming process on the wafer.

In the liquid processing apparatus disclosed in Japanese Patent Application Laid-Open No. 2007-318016, since the rinse processing starts supplying the rinse liquid immediately after the chemical processing is completed, a large amount of chemicals remains on the wafer. On this account, longer rinse time is needed in order to sufficiently remove a chemical composition. Hence, an overall time of the liquid processing including the rinse processing is increased.

SUMMARY

An exemplary embodiment of the present disclosure provides a liquid processing apparatus including: a substrate holding unit that holds a target substrate horizontally; a rotation driver that rotates the substrate holding unit around a vertical shaft; a chemical supplying unit that supplies chemicals to a bottom surface of the rotating target substrate; a rinse liquid supplying unit that supplies a rinse liquid to a bottom surface of the target substrate that is rotating; and a controller that controls the execution of a first step of supplying chemicals to the target substrate while rotating the substrate holding unit at a first rotation speed, a second step of halting the supply of the chemicals to the target substrate and rotating the substrate holding unit at a second rotation speed higher than the first rotation speed, and a third step of supplying the rinse liquid to the target substrate while rotating the substrate holding unit at a third rotation speed equal to or lower than the first rotation speed.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
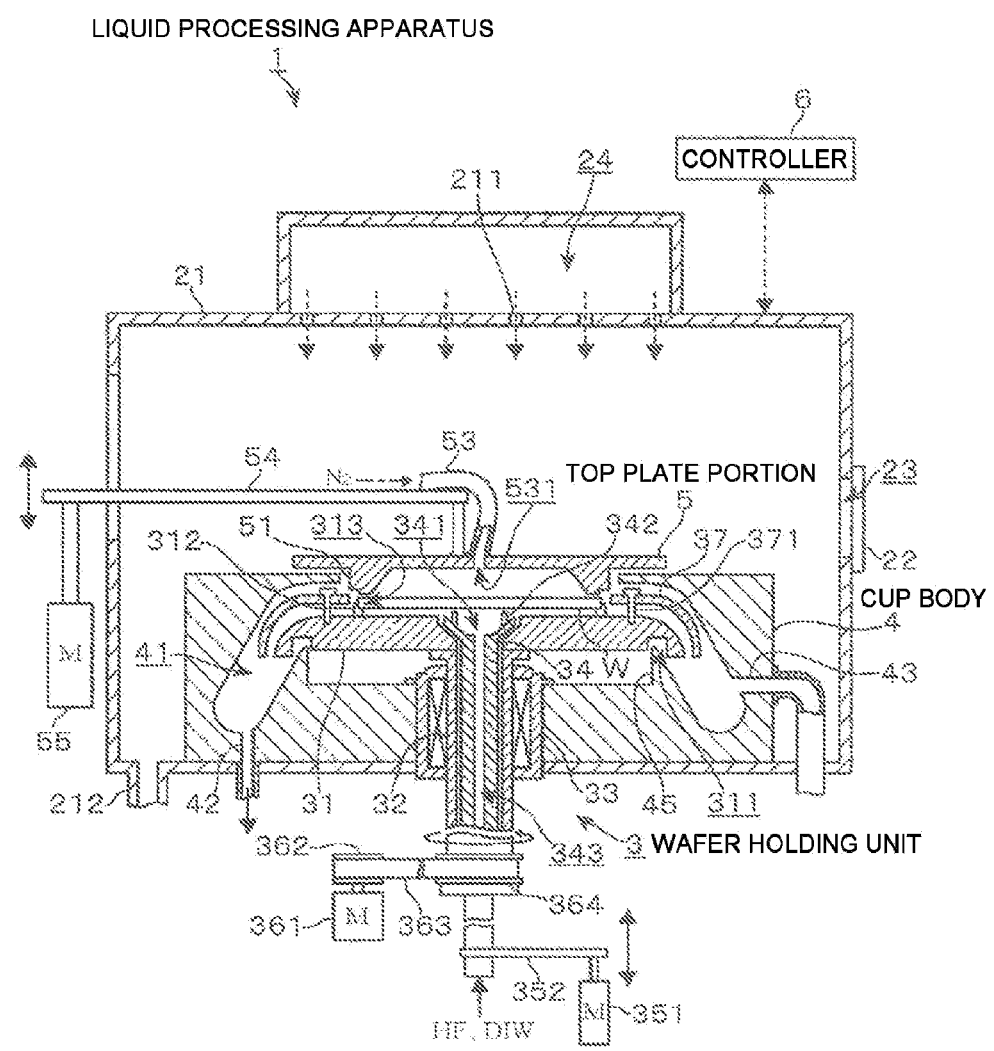
FIG. 1 is a longitudinal side view showing a configuration of a liquid processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to provide a liquid processing apparatus, a liquid processing method, and a storage medium storing the method that can efficiently remove chemicals after supplying the chemicals such as an etchant onto a bottom surface of a target substrate.

The liquid processing apparatus according to the present disclosure includes: a substrate holding unit that holds a target substrate horizontally; a rotation driver that rotates the substrate holding unit around a vertical shaft; a chemical supplying unit that supplies chemicals to a bottom surface of the rotating target substrate; a rinse liquid supplying unit that supplies a rinse liquid to a bottom surface of the target substrate that is rotating; and a controller that controls the execution of a first step of supplying chemicals to the target substrate while rotating the substrate holding unit at a first rotation speed and allowing the chemicals to flow into a top surface through a peripheral cross section of the target substrate, a second step for halting the supply of the chemicals to the target substrate and rotating the substrate holding unit at a second rotation speed higher than the first rotation speed, and a third step of supplying the rinse liquid to the target substrate while rotating the substrate holding unit at a third rotation speed lower than the first rotation speed and allowing the rinse liquid to flow into a top surface through a peripheral cross section of the target substrate.

The liquid processing apparatus may have the following features: (a) the third rotation speed lower than the first rotation speed is in the range which is decreased by 200 rotations per min with respect to the first rotation speed; (b) a timing of starting to supply the rinse liquid to the target substrate is the time when the substrate holding unit is rotated at the second rotation speed, and after the rinse liquid reaches equally the entire bottom surface of the target surface, the substrate holding unit is set to rotate at a third rotation weed while supplying the rinse liquid; (c) the third step includes a period of supplying the rinse liquid while rotating the substrate holding unit at a fourth rotation speed higher than the second rotation speed before rotating the substrate holding unit at the third rotation speed; (d) the controller increases the amount of the rinse liquid supplied to the target substrate in the third step; and (e) the controller controls the second rotation speed to be increased in the range of 50 rotations or more and 500 rotations or less per min.

According to another aspect of the present disclosure, there is provided a liquid processing method, including: supplying chemicals to a bottom surface of the target substrate while holding the target substrate horizontally and rotating the target substrate around a vertical shaft at a first rotation speed; throwing off the chemicals by halting the supply of the chemicals and rotating the target substrate at a second rotation speed higher than the first rotation speed; and supplying a rinse liquid to the bottom surface of the target substrate while rotating the target substrate at a third rotation speed equal to or lower than the first rotation speed.

The liquid processing method described above may have the following features: (a) the third rotation speed is either the same as the first rotation speed or in the range which is decreased by 200 rotations per min with respect to the first rotation speed; (b) a timing of starting to supply the rinse liquid to the target substrate is the time when the substrate holding unit is rotated at the second rotation speed; (c) the supplying of the rinse liquid to the target substrate includes a period of supplying the rinse liquid while rotating the target substrate at a fourth rotation speed higher than the second rotation speed before rotating the target substrate at the third rotation speed; (d) the amount of the rinse liquid supplied to the target substrate is increased in the supplying of the rinse liquid to the target substrate; and (e) the second rotation speed is controlled to be increased in the range of 50 rotations or more and 500 rotations or less per min with respect to the first rotation speed.

According to yet another aspect of the present disclosure, there is provided a storage medium storing a computer program used in a liquid processing apparatus that rotates a horizontally held target substrate around a vertical shaft, performs a liquid processing by supplying chemicals, and then, removes the chemicals by supplying a rinse liquid to a surface of the target substrate to which the chemicals are supplied. In particular, the computer program includes steps for executing the liquid processing method described above.

According to the liquid processing method described above, in the supplying of the rinse liquid to the target substrate while rotating the target substrate at the third rotation speed, the amount of the rinse liquid that flows to a top surface of the substrate is the same as or more than the amount in the supplying of the chemicals.

According to the exemplary embodiments of the present disclosure, chemicals are supplied to a target substrate that is horizontally held and rotated around a vertical shaft at a first rotation speed, and then, the supply of the chemicals to the target substrate is halted, and a substrate holding unit is rotated at a second rotation speed higher than the first rotation speed to throw off the chemicals. As a result, since the amount of the chemicals that remain on the target substrate is reduced, the chemicals can be effectively removed by subsequent rinse processing. Further, since the substrate holding unit is rotated at a third rotation speed lower than the first rotation speed at the time of supplying the chemicals when supplying a rinse liquid, a range in which the rinse liquid supplied to a bottom surface of the target substrate flows into a top surface through a peripheral cross section of the target substrate may be the same as or larger than that the range at the time of supplying the chemicals. As a result, the chemicals that flow into the peripheral cross section and the top surface of the target substrate can be thoroughly removed.

As an example of a liquid processing apparatus that performs liquid processing by supplying chemicals to a wafer (e.g., a target substrate), a liquid processing apparatus 1 will be described that removes an unnecessary thin film formed on a rear surface of a wafer W at the time of a film forming process on the surface of the wafer by, e.g., chemical vapor deposition (CVD). Hereinafter, referring to FIGS. 1 and 2, the configuration of liquid processing apparatus 1 according to the present disclosure will be described.

As shown in the longitudinal side view of FIG. 1, liquid processing apparatus 1 includes a wafer holding unit 3 which is a substrate holding unit that holds wafer W horizontally and rotates around a vertical shaft; and a cup body 4 disposed in a case 21 surrounding the periphery portion of wafer W held in wafer holding unit 3 and receiving chemicals dispersed from wafer W.

In a ceiling part of case 21, an airstream inflow unit 24 is provided into which clean air discharged from an external fan filter unit (FFU) flows, and the air flowing into the airstream inflow unit 24 flows into case 21 through a plurality of through-flow holes 211 formed on a ceiling surface of case 21. The clean air flowing into case 21 flows from an upper portion to a lower portion in case 21 to be discharged from an exhaust port 212 formed on a bottom surface of case 21, thereby forming a downflow in case 21. In the figures, reference numeral 23 represents a carry in/out port through which wafer W is carried in/out from outside, and reference numeral 22 represents a shutter opening and closing carry in/out port 23.

Wafer holding unit 3 includes a guide plate 31 installed on a bottom surface of wafer W held substantially horizontally to face wafer W; a cylindrical rotation shaft 32 supporting the center of guide plate 31 on the bottom surface and extending vertically downwards; and a lifter 34 penetratively inserted into rotation shaft 32 in a vertical direction and having its top end protruded and dented from an opening of the center of guide plate 31. In this example, wafer W is held in wafer holding unit 3 so that a thin film to be removed faces the bottom surface.

Figure 2:
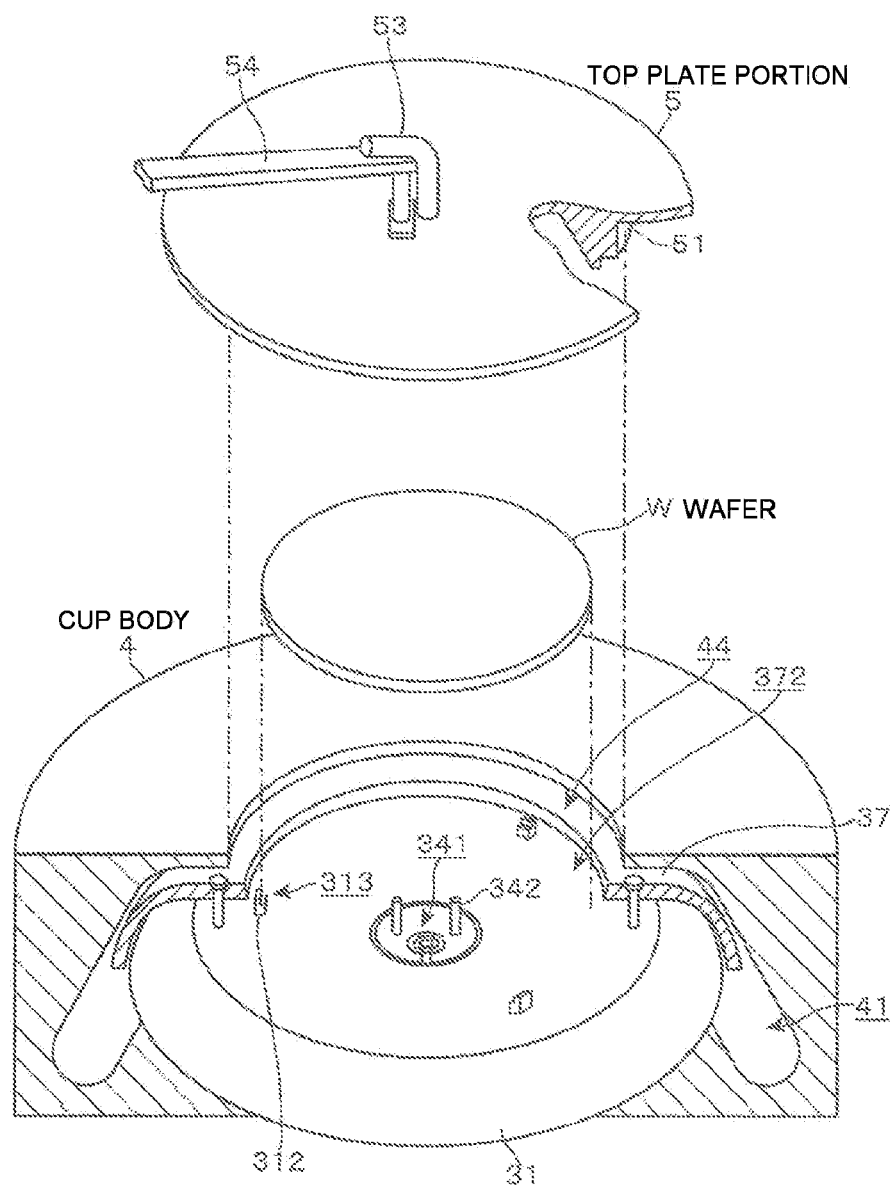
FIG. 2 is a longitudinal perspective view showing an internal configuration of the liquid processing apparatus.

Guide plate 31 is configured as a disk shaped member having a curved surface by removing an angle of a top surface of a periphery portion. A groove portion 311 is formed on a bottom surface of the periphery portion with the curved surface in a circumferential direction thereof. As shown in FIGS. 1 and 2, for example, three support pins 312 for supporting wafer W substantially in a horizontal state on a flat region in the vicinity of the center rather than the periphery portion with the curved surface are installed on the top surface of guide plate 31 at regular intervals in a circumferential direction thereof. Support pin 312 includes a notch portion 313 for supporting the periphery portion of wafer W on the bottom surface.

Rotation shaft 32 supporting guide plate 31 on the bottom surface is supported on the bottom surfaces of cup body 4 and case 21 through a bearing unit 33 including a bearing. A lower end of rotation shaft 32 protrudes downwards from the bottom surface of case 21 and a pulley 364 is installed at the lower end thereof, while a rotation motor 361 is disposed at a lateral position of rotation shaft 32, and a pulley 362 is installed as well on a rotation shaft of rotation motor 361. In addition, a rotation driver is configured by winding a driving belt 363 to two pulleys 362 and 364, and rotation shaft 32 is rotated at a desired rotation speed (the number of rotations per unit hour) by driving rotation motor 361, and as a result, guide plate 31 and wafer W held on guide plate 31 may be rotated.

An opening 341 which is widened in a bowl shape is formed on the upper end of lifter 34 penetratively inserted into rotation shaft 32. As shown in FIG. 1, for example, three support pins 342 supporting wafer W on the bottom surface when lifter 34 protrudes from the top surface of guide plate 31 are installed on an inclined surface of opening 341. Meanwhile, a cylinder motor 351 is connected to the lower end of lifter 34 through a lifting plate 352, and lifting plate 352 and lifter 34 may be moved vertically by driving cylinder motor 351. As a result, lifter 34 protrudes from the top surface of guide plate 31 to transfer wafer W between a pick 101 that enters into an upper portion of lifter 34 and support pin 342.

Further, inside lifter 34, a liquid passage 343 is formed to penetrate lifter 34 vertically. Liquid passage 343 serves to supply an HF solution as a chemical or DIW as a rinse liquid to the bottom surface of wafer W through opening 341 installed on the upper end of lifter 34. A base end of liquid passage 343 is connected to an HF solution supply source or a rinse liquid supply source retaining the HF solution or rinse liquid. Therefore, liquid passage 343 and the HF solution supply source connected to liquid passage 343 correspond to a chemical supplying unit according to the exemplary embodiment. At the same time, liquid passage 343 also serves as a rinse liquid supplying unit in cooperation with the rinse liquid supply source.

Further, as shown in FIGS. 1 and 2, a direction plate 37 is disposed at an upper position of the periphery portion with the curved surface in guide plate 31 as described above. A concave curved surface corresponding to a curved surface (convex curved surface) of guide plate 31 is formed on a bottom surface of direction plate 37, and direction plate 37 is molded in an annular shape to entirely surround the periphery of guide plate 31. An opening 372 having a diameter larger than wafer W is formed at the center of a top surface of direction plate 37 (see FIG. 2). As shown in FIG. 1, wafer W on support pin 312 of guide plate 31 is disposed on the inside of opening 372 of direction plate 37.

Direction plate 37 is fixed to an upper position of guide plate 31 by a fixation pin 371 so that a gap is formed between the top curved surface of guide plate 31 and the bottom curved surface of direction plate 37. The HF solution or rinse liquid that is supplied from opening 341 of lifter 34 and dispersed through a gap between the bottom surface of wafer W and the top surface of guide plate 31 flows from the gap between guide plate 31 and direction plate 37 to be guided toward cup body 4.

As shown in FIG. 2, cup body 4 includes, e.g., a concave portion (hereinafter, a portion where the concave portion is opened is referred to as an "opening 44") opened to a central region toward a top surface of a flat cylindrical member. Cup body 4 also includes a liquid receiving space 41 formed to surround the concave portion, extended to be gradually widened toward a lower end at the periphery of the cylindrical member from an upper end of the concave portion, and having an inner peripheral surface of which a longitudinal cross section has a U shape.

Guide plate 31 and direction plate 37 are supported on rotation shaft 32 that penetrates a bottom surface of cup body 4 to be stored in the concave portion of cup body 4 as described above. Peripheries of guide plate 31 and direction plate 37 extend up to an upper portion of liquid receiving space 41. In addition, a concave curved surface corresponding to a top curved surface (convex curved surface) of direction plate 37 is formed in the upper portion of liquid receiving space 41, and direction plate 37 is disposed in cup body 4. Further, a gap is formed as well between a top surface of direction plate 37 and an inner surface of liquid receiving space 41 to allow purge gas to be described below to flow through. Moreover, reference numeral 45 in FIG. 1 represents a projection portion extended into groove portion 311 formed on the bottom surface of guide plate 31 to form a narrow space and preventing gas that flows in liquid receiving space 41 from being introduced into rotation shaft 32.

A liquid discharging port 42 for discharging the HF solution or rinse liquid collected in liquid receiving space 41 is formed on the bottom of liquid receiving space 41. Further, for example, a suction exhaust port 43 for discharging the gas introduced into liquid receiving space 41 is formed on a side wall surface of liquid receiving space 41. A compressor (not shown) is connected to suction exhaust port 43 and suction-discharges the gas in liquid receiving space 41 to maintain the inside of liquid receiving space 41 at a negative pressure, lower than the pressure in case 21 outside cup body 4.

Further, at an upper position of cup body 4, there is installed a disk-shaped top plate portion 5 closing opening 44 of cup body 4 and forming a flat space with wafer W held on guide plate 31. A top surface of top plate portion 5 is cantilever-supported by, for example, a support beam 54, and support beam 54 is connected to a cylinder motor 55. Top plate portion 5 may be lifted between a processing position facing the top surface of wafer W in cup body 4 by driving cylinder motor 55 and a retreating position moving upwards from the processing position.

Further, at the center of top plate portion 5, there is formed a purge gas supply port 531 for supplying inert gas such as nitrogen gas as the purge gas into a space formed between wafer W and top plate portion 5. A purge gas supply pipe 53 connected to a purge gas supply source (not shown) is connected to purge gas supply port 531.

Meanwhile, on a bottom surface of top plate portion 5, there is formed an annular projection portion 51 that is configured to fit in the inside of opening 44 of cup body 4 and protrudes toward a lower layer of top plate portion 5. A taper shaped inclined surface extending upwards toward the inner periphery from the outer periphery is formed on the inner periphery of projection portion 51 to guide gas supplied into a space between wafer W and top plate portion 5 toward the gap.

Projection portion 51 forms a narrow gap together with wafer W and serves to discharge the gas in a central space to liquid receiving space 41. Further, projection portion 51 partitions an atmosphere in liquid receiving space 41 from the space formed between wafer W and top plate portion 5, thereby serving to prevent HF gas or mist from flowing backward from liquid receiving space 41 as well.

A controller 6 is connected to liquid processing apparatus 1 having the above-mentioned configuration as shown in FIG. 1. Controller 6, for example, includes a computer including a CPU and a storage unit (not shown). In the storage unit, a program may be stored including a step (command) group for a control associated with an operation of liquid processing apparatus 1. Specifically, the operation includes carrying wafer W into each liquid processing apparatus 1, removing a thin film formed on a rear surface (e.g., the bottom surface of FIG. 1) of wafer by performing a liquid processing in liquid processing apparatus 1, and carrying out wafer W from each liquid processing apparatus 1. This program is stored in storage media such as a hard disk, a compact disk, a magneto-optical disk, and a memory card and installed in the computer therefrom.

In particular, in a liquid processing operation by liquid processing apparatus 1, controller 6 serves to switch a supply timing of the HF solution or rinse liquid, supply flow rate, or a rotation speed of guide plate 31 (that is, a rotation speed of wafer W held on wafer holding unit 3) during a supply period of the processing liquid on the basis of a predetermined schedule.

Figure 3:
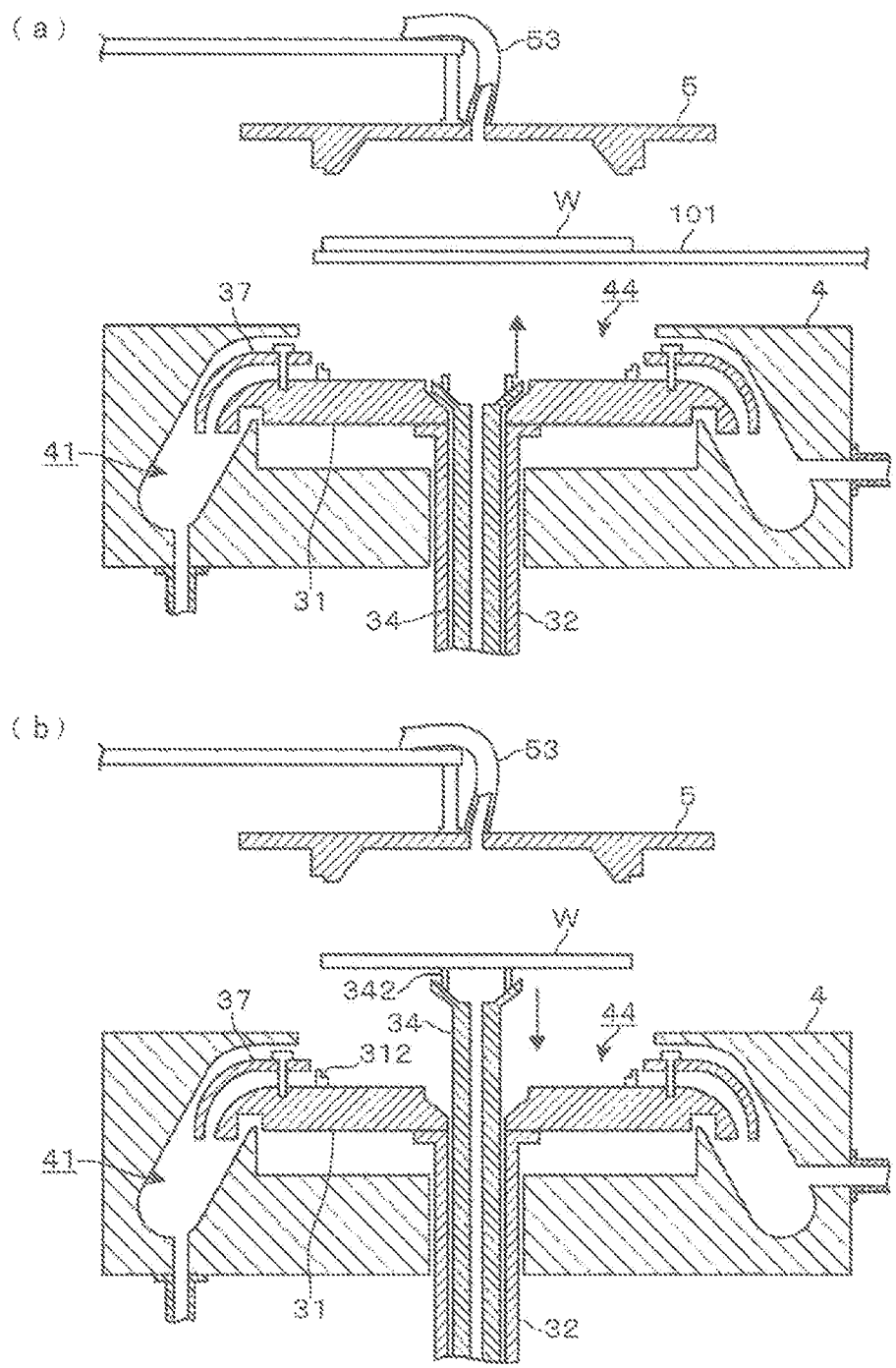
FIG. 3 is an explanatory diagram showing a carry-in operation of a wafer into the liquid processing apparatus.

The operation of liquid processing apparatus 1 according to the exemplary embodiment of the present disclosure having the above-mentioned configuration will be described. First, liquid processing apparatus 1 stands by while retreating top plate portion 5 up to the retreating position as shown in FIG. 3A. In addition, when shutter 22 of case 21 is opened, pick 101 of an external wafer transportation mechanism enters case 21 while holding wafer W and pick 101 stops at a height position between top plate portion 5 and opening 44 of cup body 4. Continuously, lifter 34 moves up to cross pick 101 as shown in FIG. 3B, and wafer W is transferred onto support pin 342 of lifter 34. Then, pick 101 retreats to the outside of case 21 and shutter 22 is closed.

Lifter 34 is dented into rotation shaft 32 to hold wafer W on support pin 312, and allows top plate portion 5 to descend up to the processing position, thereby completing a preparation of starting the liquid processing. In this case, the downflow of the clean air is continuously formed in case 21. Further, in FIGS. 3A and 3B, and FIG. 4, the bearing unit 33 penetrating the bottom surface of cup body 4 is not shown.

Figure 4:
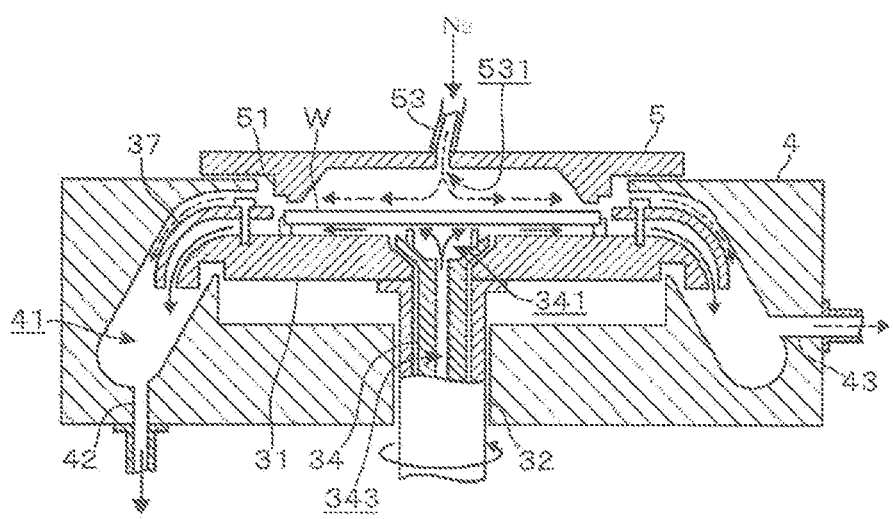
FIG. 4 is an explanatory diagram showing an internal state of the liquid processing apparatus during a liquid processing period.

When the above-mentioned operation is terminated, rotation shaft 32 is rotated based on a schedule as described below and the processing liquid (e.g., HF solution or rinse liquid) is supplied from liquid passage 343, as shown in FIG. 4. The processing liquid discharged from opening 341 of liquid passage 343 flows from the center to the periphery to be diffused to the entire bottom surface of wafer W in the space between wafer W and guide plate 31 by centrifugal force generated through rotation of guide plate 31.

In the case where HF solution is supplied as the processing liquid, the HF solution contacts the bottom surface of wafer W to dissolve the thin film, thereby removing an unnecessary film. Meanwhile, at the time of supplying the rinse liquid, the HF solution that remains on the surface of wafer W is diluted with the rinse liquid diffused on the bottom surface of wafer W and flows to a downstream side, thereby being removed. The HF solution that discharged from the bottom surface of wafer W flows into the gap between guide plate 31 and direction plate 37 to drop into liquid receiving space 41.

Meanwhile, on the top surface of wafer W, pressurized purge gas is supplied from purge gas supply pipe 53 into to the space between wafer W and top plate portion 5, and flows from the center to the periphery portion of wafer W.

The purge gas flows from the center to the periphery portion in the space between guide plate 31 and wafer W, reaches in a region where projection portion 51 is formed, and flows into liquid receiving space 41 having the negative pressure by suction discharge. In addition, the purge gas discharged from the narrow gap between wafer W and projection portion 51, passes through the gap between direction plate 37 and liquid receiving space 41, and flows into a lower space of liquid receiving space 41. The flow of the purge gas is formed to prevent a forming region of the semiconductor device from being etched by the mist of the HF solution or HF gas flowing to the top surface of wafer W.

The liquid processing apparatus according to the exemplary embodiment switches the rotation speed of wafer W and the supply timing of the processing liquid on the basis of a predetermined schedule to shorten the time required for rinse processing and acquire an excellent rinse processing result at the time of supplying the processing liquid. Hereinafter, the liquid processing (chemical processing and rinse processing) will be described in detail with reference to FIGS. 5 to 7.

Figure 5:
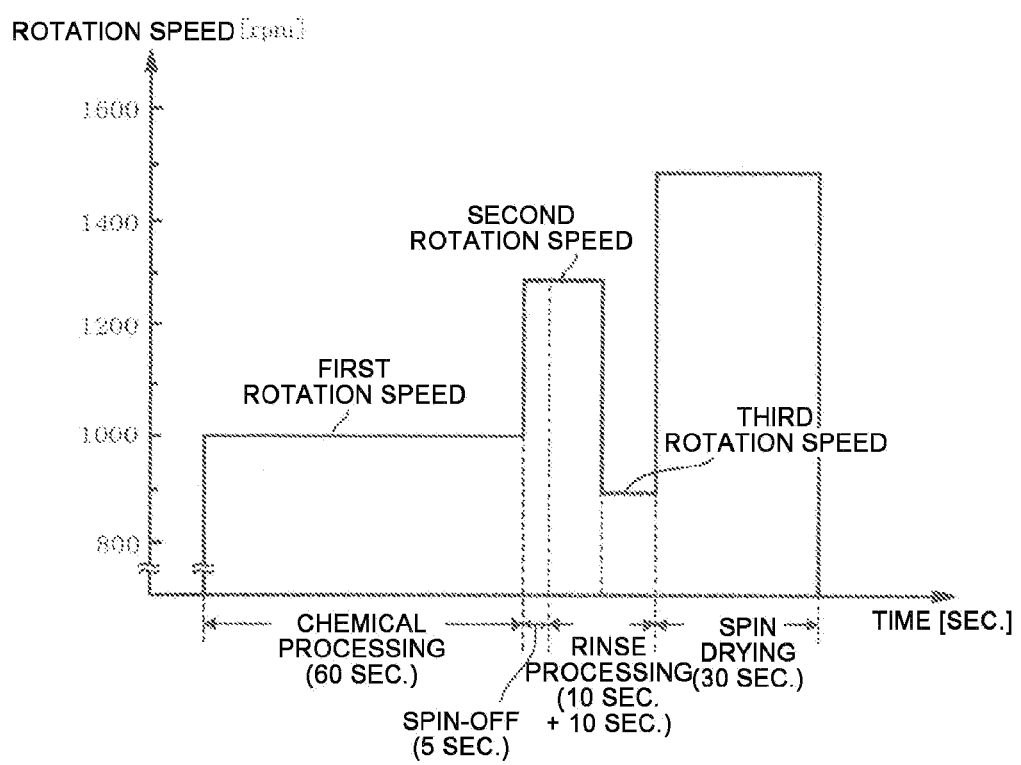
FIG. 5 is an explanatory diagram showing a rotation speed of a wafer in each process of liquid processing.
Figure 6:
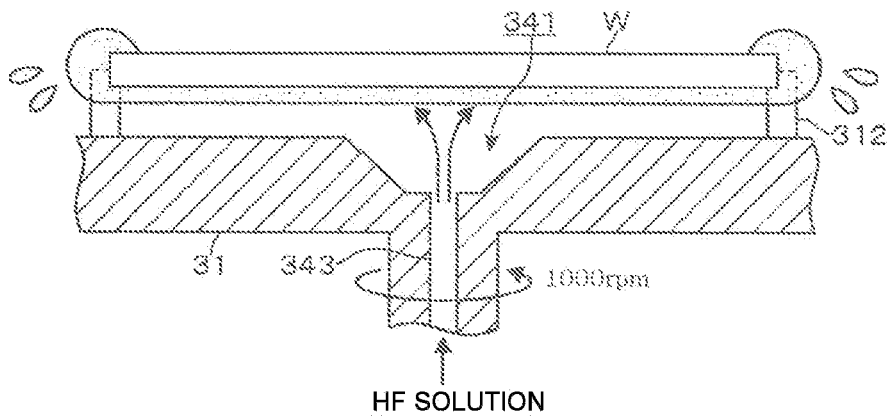
FIG. 6 is a first explanatory diagram showing an operation of the liquid processing apparatus.
Figure 6:
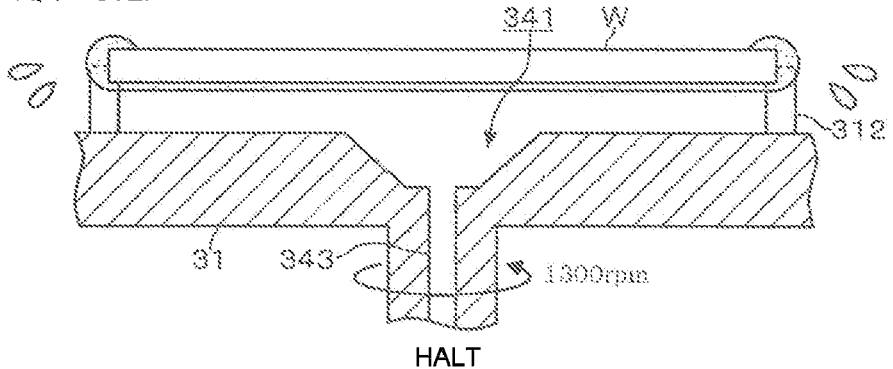
Figure 6:
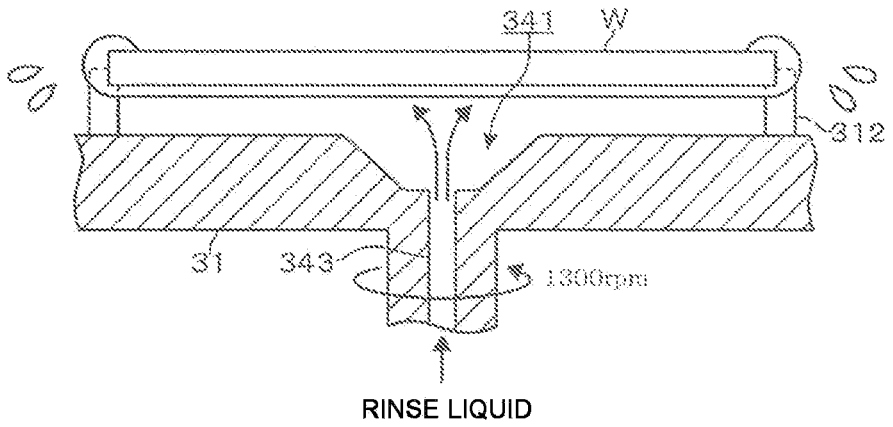
Figure 7:
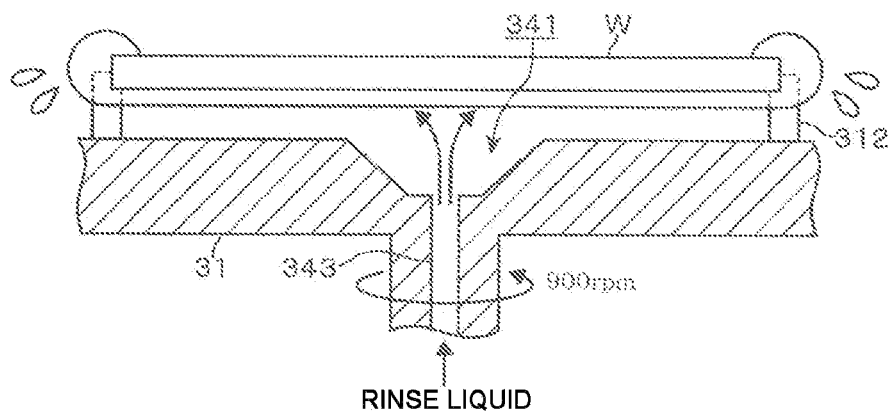
FIG. 7 is a second explanatory diagram showing an operation of the liquid processing apparatus.
Figure 7:
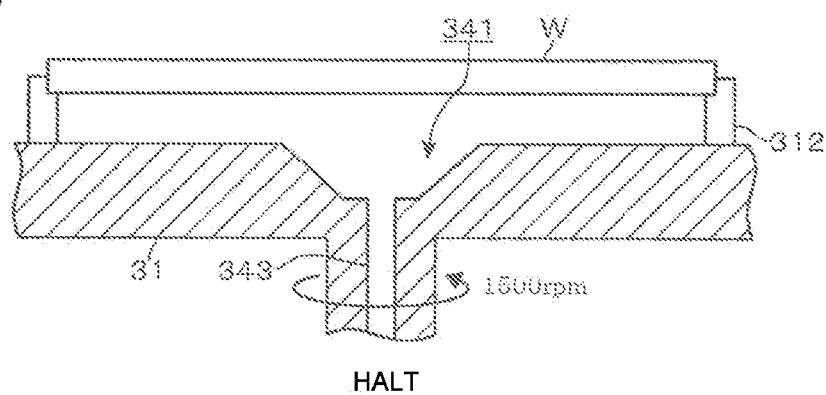

FIG. 5 shows an example of setting the rotation speed of guide plate 31 in each of chemical processing, rinse processing, and thereafter spin drying executed with respect to, for example, a wafer having a diameter of 300 mm in liquid processing apparatus 1. In FIG. 5, a transverse axis represents a content of each processing and an execution time of the processing in second, and a longitudinal axis represents a set value of the rotation speed of guide plate 31 in rpm (rotations/min). When the speed is changed, a time required until the rotation speed of guide plate 31 reaches the set value is short enough as tens of milliseconds to hundreds of milliseconds, and wafer W may also be actually rotated at substantially the same rotation speed as the set value shown in FIG. 5. Further, FIGS. 6 and 7 are schematic diagrams showing a state in which wafer W is rotated while being held on guide plate 31. For convenience, top plate portion 5, projection portion 51, and lifter 34 are omitted.

When wafer W is held on guide plate 31 and the chemical processing is ready to be started, guide plate 31 is rotated at, for example, 1000 rpm (a first rotation speed) which is in the range of 500 to 1500 rpm as shown in FIG. 5, and the HF solution is supplied from liquid passage 343 to the bottom surface of wafer W at the rotation speed (the first step, hereinafter, referred to as "Step 1"). Although the first rotation speed or the supply rate of the chemicals may be set appropriately depending on the size of wafer W or the type of the chemicals, the first rotation speed or the supply rate of the chemicals is set to a value to diffuse the HF solution to the entirety of wafer W and sufficiently remove the thin film formed on this surface in the exemplary embodiment.

When the HF solution is supplied, a liquid film of the HF solution is formed on the bottom surface of wafer W as shown in FIG. 6A, and the thin film is removed in contact with the liquid film. In addition, the HF solution that is diffused to the entire bottom surface of wafer W to remove the thin film reaches an outer periphery portion of wafer W and is scattered to be discharged to liquid receiving space 41.

Meanwhile, some of the HF solution flows to the top surface through a peripheral surface of wafer W to remove the thin film formed in an outer peripheral region. Further, since the HF solution that flows to the top surface of wafer W is pushed back by the purge gas discharged from projection portion 51, as described above, formed on the top plate portion 5, the HF solution cannot invade the forming region of the semiconductor device.

By this way, the chemical processing is performed for a predetermined set time sufficient to remove the thin film of wafer W, for example, only 60 sec, and thereafter, the supply of HF solution is halted. In addition, guide plate 31 is rotated at 1300 rpm (the second rotation speed) higher than the first rotation speed by, for example, approximately 300 rpm which is in the range of 50 to 500 rpm (the second step, hereinafter, referred to as "Step 2"). The supply of the HF solution is halted, and in addition, the rotation speed of wafer W is increased, such that the HF solution is dripped off therearound. As a result, the liquid film of the HF solution that flows into and is attached to the bottom surface, the peripheral cross section, and the top surface of wafer W becomes thinner as shown in FIG. 6B.

Hereinafter, in Step 2, a dripping (throwing-off) operation of the HF solution made by establishing two conditions: (1) halting the supply of the HF solution and (2) increasing the rotation speed of wafer W, is referred to as a spin-off. In the exemplary embodiment, the spin-off is set to be executed in the range of 5 to 20 sec, for example, for 5 sec.

The length of the time to execute the spin-off may be appropriately set depending on the size of wafer W or the type of the chemicals. However, when, e.g., the time is less than 5 sec, that is, relatively short, an effect of dripping the chemicals may not be sufficiently acquired, and as a result, a time required for the rinse processing may not be shortened. Meanwhile, when the spin-off time is more than 20 sec, that is, relatively long, an overall processing time of the liquid processing may not be shortened.

Thus, when a predetermined set time is elapsed while executing the spin-off, the processing liquid supplied to liquid passage 343 is replaced with the rinse liquid to start rinse washing. As shown in FIG. 5, in the exemplary embodiment, the rinse washing starts while the rotation speed of wafer W is maintained at the second rotation speed. In respects to the rinse liquid, if the rinse liquid has an amount enough to remove the remaining HF solution by sufficiently diffusing the rinse liquid to the entire bottom surface of wafer W at the second rotation speed, the supply rate thereof may be set appropriately. For example, when the supply rate of the rinse liquid is the same as that of the HF solution, a liquid film thinner than that in Step 1 is formed on the bottom surface of wafer W as shown in FIG. 6C.

As described above, by starting the supplying of the rinse liquid while rotating wafer W at the rotation speed higher than the first rotation speed, the time required to diffuse the rinse liquid to the entire bottom surface of wafer W becomes shorter than that in the case of maintaining the first rotation speed. Further, by performing the spin-off in preceding Step 2, the amount of the HF solution that remains on the bottom surface of wafer W decreases, and as a result, the HF solution may be removed in a shorter time.

Therefore, the rinse liquid is supplied at the second rotation speed, for example, for 10 sec, and thereafter, the rotation speed of guide plate 31 is decreased to the third rotation speed equal to or lower than the first rotation speed (the third step, hereinafter, referred to as "Step 3"). Since the amount of the processing liquid that flows to the peripheral cross section and the top surface of wafer W decreases as the rotation speed of wafer W increases, the amount of the rinse liquid that flows to the peripheral cross section and the top surface of wafer W may be increased by decreasing the rotation speed of wafer W as compared with that before decreasing the number of rotations. In particular, as the third rotation speed is equal to or lower than the first rotation speed at the time of supplying the HF solution, the rinse liquid may flow into a range as large as the region where the HF solution flows to the top surface of wafer W or an inner region of wafer W larger than the range. As a result, a sufficient amount of the rinse liquid is supplied to the outer peripheral regions of the peripheral cross section and the top surface of wafer W to which the HF solution is supplied to remove the HF solution that remains in the regions (see, e.g., FIG. 7A).

The rotation speed of wafer W in Step 3 is adjusted to, for example, a range up to the same as or 200 rpm lower than the first rotation speed from the viewpoint that the amount of the rinse liquid that flows in at the time of the rinse processing is equal to or more than that at the time of the chemical processing. From this viewpoint, in the liquid processing apparatus according to the exemplary embodiment, the third rotation speed is adjusted to 900 rpm, that is, 100 rpm lower than the first rotation speed. In other words, the rotation speed is approximately 400 rpm lower than the second rotation speed. During the period when wafer W is rotated at the third rotation speed, the flow rate of the rinse liquid and the amount of the rinse liquid that flows into the top surface of wafer W may be increased as compared with the period when wafer W is rotated at the second rotation speed.

Therefore, the rinse processing of Step 3 is performed, e.g., for 10 sec, and thereafter, the supply of the rinse liquid is halted, and the rotation speed of guide plate 31 is increased up to 1500 rpm to perform the spin drying, as shown in FIGS. 5 and 7B. Accordingly, the rinse liquid that remains on the rear surface of wafer W is removed and a series of liquid processing operations are terminated.

The unnecessary thin film formed on the bottom surface (rear surface) of wafer W is removed by the above-mentioned operation and thereafter, when the rinse processing and spin drying are terminated, guide plate 31 stops to rotate. In addition, the purge gas stops to be supplied from purge gas supply port 531 and thereafter, top plate portion 5 is lifted up to the retreating position to transfer wafer W from lifter 34 to pick 101, and wafer W is carried out from liquid processing apparatus 1 by an opposite operation to the carry-in operation.

Liquid processing apparatus 1 according to the exemplary embodiment provides the following effects. The chemicals are supplied to wafer W that is held horizontally and rotates around the vertical shaft at a first rotation speed, the HF solution stops to be supplied to wafer W, and guide plate 31 is rotated at a second rotation speed higher than the first rotation speed in supplying the HF solution to throw off the HF solution. As a result, since the amount of the chemicals that remain on wafer W is reduced, the HF solution can be effectively removed by the subsequent rinse processing. Further, since guide plate 31 is rotated at the third rotation speed equal to or lower than the first rotation speed at the time of supplying the HF solution when supplying the rinse liquid, a range in which the rinse liquid supplied to the bottom surface of wafer W flows into the top surface through the peripheral cross section of wafer W may be the same as or larger than that at the time of supplying the chemicals. As a result, the HF solution that flows into the peripheral cross section and the top surface of wafer W can be thoroughly removed.

Figure 8:
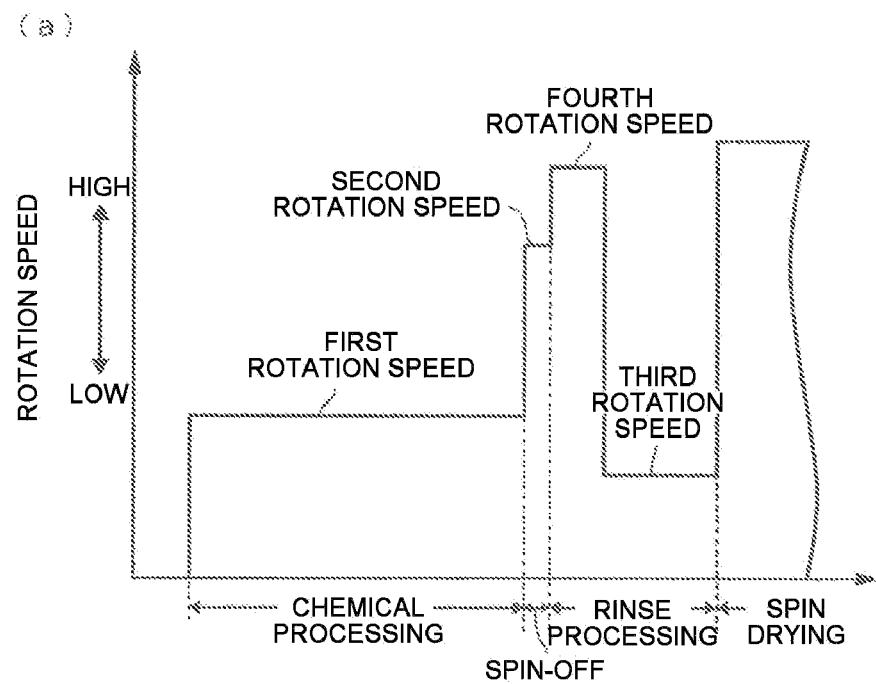
FIG. 8 is an explanatory diagram showing another example of a rotation speed of a wafer in each process of liquid processing.
Figure 8:
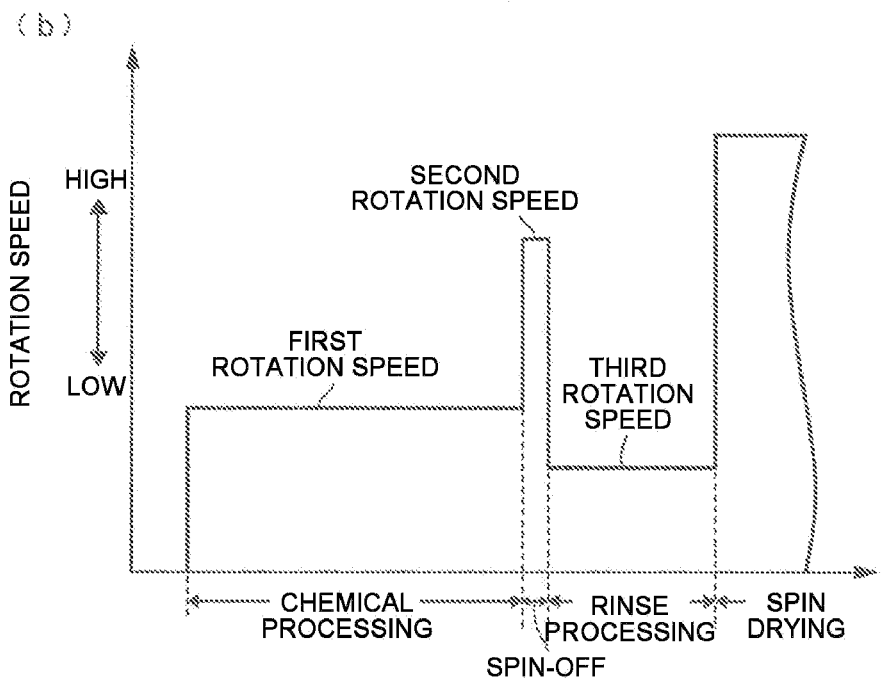

Herein, setting the rotation speed (that is, the rotation speed of wafer W) of guide plate 31 holding wafer W is not limited to the example shown in FIG. 5. For example, as shown in FIG. 8A, when the rinse liquid is supplied after the spin-off is executed and thereafter, a period when wafer W is rotated at a fourth rotation speed higher than the second rotation speed by increasing the rotation speed of water W is set and thereafter, the rotation speed of wafer W may be decreased up to the third rotation speed. As a result, the time required to diffuse the rinse liquid to a front surface of wafer W becomes much shorter to shorten the rinse processing time.

Further, in Step 3, the timing when the rinse liquid starts to be supplied is not limited to the time when wafer W is rotated at the second rotation speed or the fourth rotation speed higher than the second rotation speed. For example, as shown in FIG. 8B, just after the spin-off is executed, the rotation speed of wafer W is decreased up to the third rotation speed and thereafter, the rinse liquid may start to be supplied. Even in this case, the HF solution may be thrown off and in addition, the rinse liquid may flow to the range as large as or larger than that at the time of supplying the HF solution, and as a result, a significant removal effect of the HF solution can be obtained.

In addition, when transferred from Step 1 to Step 2, the timing of halting the chemicals may be not the same as the timing when the rotation speed of wafer W is switched from the first rotation speed to the second rotation speed. The chemicals may be halted just before the switching or after the switching. In addition, as long as both conditions of the switching of the rotation speed to the second rotation speed and the halting of the chemicals can be established, it does not matter which timing is first or later. Further, similarly, the timing of starting to supply the rinse liquid may be before or after the second rotation speed is switched to the fourth rotation speed in the case of FIG. 8A.

Further, the chemicals according to the present disclosure are not limited to the HF solution and may be hydrogen peroxide, a sulfuric acid solution, a nitric acid solution, ammonia water, or a mixture thereof. In addition, the rinse liquid may be distilled water in addition to DIW. Furthermore, the target substrate is not limited to a circular wafer and, for example, may be an angular substrate.

EXAMPLES

Experiment

An experiment was performed by comparing the number of defects generated between the liquid processing of the exemplary embodiment in which the rinse processing is performed by increasing the rotation speed of wafer W from the first rotation speed to the second rotation speed by setting the spin-off process after the HF processing and the known liquid processing.

A. Experimental Condition

Example

The bottom surface of wafer W was processed through the process shown in FIG. 5 using liquid processing apparatus 1 shown in FIG. 1. No thin film was formed on wafer W to be assessed. A removal effect of the chemicals was assessed by counting a difference in the number of defects having a diameter of 12 μm or more, which were attached to a target surface of wafer W before and after the liquid processing. The HF solution as the chemical and the DIW as the rinse liquid were supplied with a flow rate of 0.6 l/min, respectively. From the start of the chemical processing to the termination of the rinse processing, the liquid processing took 85 sec in total. If the HF solution is not sufficiently removed by the rinse liquid processing, wafer W is etched by the HF solution, such that the defects are generated. Therefore, the rinse liquid processing effect can be assessed by counting the number of the defects.

Comparative Example

Figure 9:
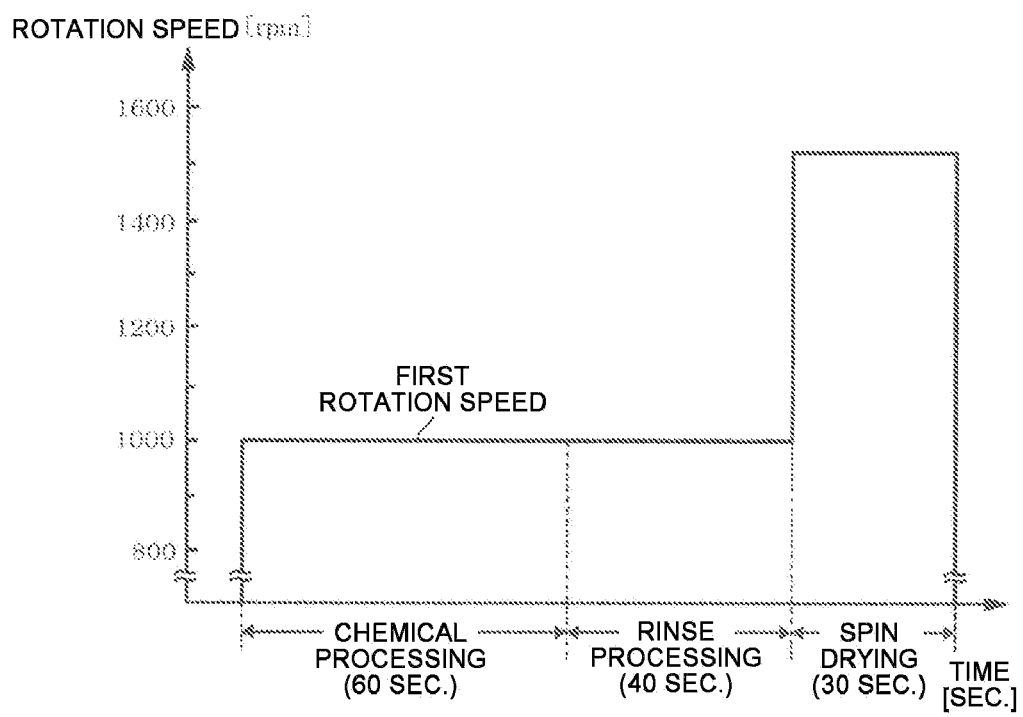
FIG. 9 is an explanatory diagram showing a rotation speed of a wafer in each process of liquid processing according to Comparative example.

Except that the liquid processing was performed as shown in FIG. 9, liquid processing apparatus 1, the processing liquid (e.g., the HF solution as the chemical and the DIW as the processing liquid), and the supply flow rate of the processing liquid were the same as those of the Example. As shown in FIG. 9, in the Comparative Example, after the liquid processing was performed, the spin-off process was not set and the rinse processing was performed for 40 sec, while maintaining at the first rotation speed. From the start of the chemical processing to the termination of the rinse processing, the liquid processing took 100 sec in total.

B. Experimental Result

Figure 10:
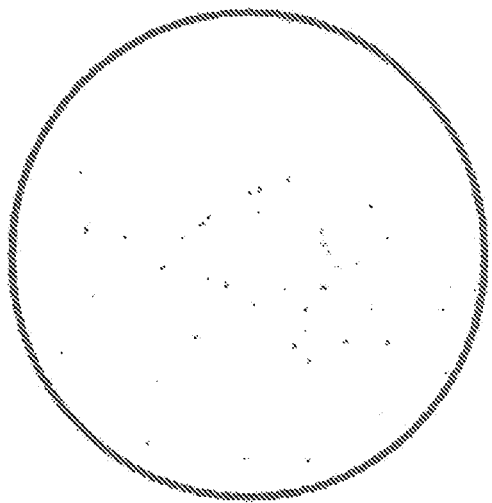
FIG. 10 is an explanatory diagram showing a state of a wafer after rinse processing according to exemplary embodiment and comparative example.
Figure 10:
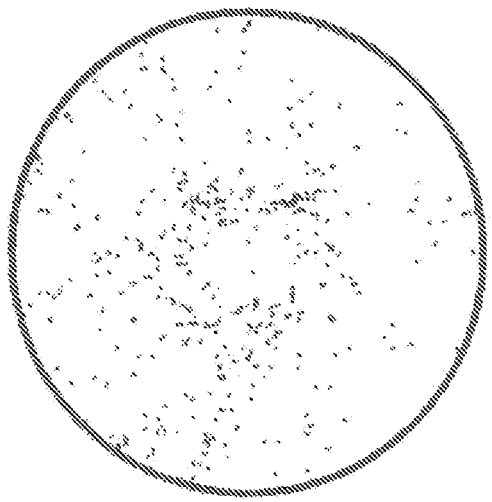

In the Example and the Comparative Example, results are shown in FIG. 10 in which positions where the defects having a diameter of 12 μm or more are generated are marked on wafer W. FIGS. 10A and 10B show the results of the Example and the Comparative Example, respectively.

According to the result of the Example shown in FIG. 10A, the number of the defects after the liquid processing was merely 51. In contrast, in the Comparative Example shown in FIG. 10B, the number of the defects was 539. The chemical processing time was the same in the Example and the Comparative Example. The rinse processing time of the Example was merely 20 sec, while the rinse processing time of the Comparative Example was 40 sec. The difference in the number of generated defects may be represented as a difference in the rinse processing effect.

From the comparison of the experimental results, the spin-off process is set and the rotation speed of wafer W is increased from the first rotation speed (1000 rpm) to the second rotation speed (1300 rpm) at the time of starting to supply the rinse liquid, thereby acquiring an excellent rinse processing effect compared to the known method. Moreover, the rinse processing time of Example is shorter than that of the Comparative Example by 20 sec and the excellent rinse processing effect can be acquired within a shorter time than the known method by applying the present disclosure.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A liquid processing method, comprising:
supplying chemicals to a bottom surface of a target substrate while holding the target substrate horizontally on a substrate holding unit and rotating the target substrate around a vertical shaft of the substrate holding unit at a first rotation speed and allowing the chemicals to flow onto a top surface of the target substrate through a peripheral cross section of the target substrate;
throwing off the chemicals by halting the supply of the chemicals and rotating the target substrate at a second rotation speed higher than the first rotation speed; and
supplying a rinse liquid to the bottom surface of the target substrate while rotating the target substrate at a third rotation speed lower than the first rotation speed and allowing the rinse liquid to flow onto the top surface of the target substrate through the peripheral cross section of the target substrate,
wherein the supplying of the rinse liquid to the target substrate includes a period of supplying the rinse liquid while rotating the target substrate at a fourth rotation speed higher than the second rotation speed before rotating the target substrate at the third rotation speed.

2. The method of claim 1, wherein the third rotation speed lower than the first rotation speed is in the range which is decreased by 200 rotations per min with respect to the first rotation speed.

3. The method of claim 1, wherein a timing of starting to supply the rinse liquid to the target substrate is the time when the substrate holding unit is rotated at the second rotation speed.

4. The method of claim 1, wherein an amount of the rinse liquid supplied to the target substrate is increased in the supplying of the rinse liquid to the target substrate.

5. The method of claim 1, wherein the second rotation speed is controlled to be increased in the range of 50 rotations or more and 500 rotations or less per min with respect to the first rotation speed.

6. A storage medium storing a computer program used in a liquid processing apparatus, the liquid processing apparatus comprising a substrate holding unit that rotates a horizontally held target substrate around a vertical shaft of the substrate holding unit, performs a liquid processing method by supplying chemicals, and then, removes the chemicals by supplying a rinse liquid to a surface of the target substrate to which the chemicals are supplied, wherein the computer program includes steps for executing the liquid processing method of claim 1.

* * * * *